United States Patent
Vogler et al.

(10) Patent No.: US 9,513,452 B2
(45) Date of Patent: Dec. 6, 2016

(54) DAMPING DEVICE

(75) Inventors: Alexander Vogler, Aalen (DE); Klaus Rief, Aalen-Oberalfingen (DE); Andreas Frommeyer, Schwaebisch Gmuend (DE); Alan L. Brydon, Erding (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 250 days.

(21) Appl. No.: 13/185,177

(22) Filed: Jul. 18, 2011

(65) Prior Publication Data

US 2012/0138401 A1 Jun. 7, 2012

Related U.S. Application Data

(63) Continuation of application No. PCT/EP2010/000200, filed on Jan. 15, 2010.

(30) Foreign Application Priority Data

Jan. 20, 2009 (DE) .................. 10 2009 005 954

(51) Int. Cl.
| | | |
|---|---|---|
| *F16F 7/10* | (2006.01) | |
| *G02B 7/00* | (2006.01) | |
| *F16F 7/104* | (2006.01) | |
| *G02B 7/02* | (2006.01) | |
| *G03F 7/20* | (2006.01) | |

(52) U.S. Cl.
CPC .............. *G02B 7/00* (2013.01); *F16F 7/104* (2013.01); *G02B 7/02* (2013.01); *G03F 7/709* (2013.01); *G03F 7/70825* (2013.01)

(58) Field of Classification Search
CPC .. F16F 15/022; G03F 7/709; G03F 7/70808; G03F 7/0002

USPC .............. 188/378, 379, 381; 355/52, 53, 55
See application file for complete search history.

(56) References Cited

U.S. PATENT DOCUMENTS

| | | | | |
|---|---|---|---|---|
| 3,690,414 A | | 9/1972 | Aggarwal et al. | |
| 3,904,276 A | * | 9/1975 | Whitaker et al. | 359/819 |
| 4,057,332 A | * | 11/1977 | Brubaker et al. | 359/894 |
| 4,778,252 A | * | 10/1988 | Filho | 359/819 |
| 4,850,674 A | * | 7/1989 | Hasselskog | 359/820 |

(Continued)

FOREIGN PATENT DOCUMENTS

| | | |
|---|---|---|
| CN | 1442755 A | 9/2003 |
| DE | 102 54 344 | 6/2004 |

(Continued)

OTHER PUBLICATIONS

Japanese Office Action, with English translation, for corresponding JP Appl No. 2011-545684, dated Jan. 10, 2012.

(Continued)

*Primary Examiner* — Thomas J Williams
*Assistant Examiner* — Mahbubur Rashid
(74) *Attorney, Agent, or Firm* — Fish & Richardson P.C.

(57) ABSTRACT

A damping device of an optical element of a projection exposure machine includes at least two mass dampers arranged spaced apart from one another, the vibration absorbers each having at least one damper mass and at least one damping element and the damper masses of the at least two mass dampers being interconnected by at least one connecting element. The optical element can be part of a projection exposure machine.

34 Claims, 4 Drawing Sheets

(56) References Cited

U.S. PATENT DOCUMENTS

| | | | |
|---|---|---|---|
| 4,929,054 A * | 5/1990 | Ahmad et al. | 359/820 |
| 5,117,311 A * | 5/1992 | Nomura | 359/819 |
| 5,428,482 A * | 6/1995 | Bruning et al. | 359/827 |
| 5,523,893 A * | 6/1996 | Haas | 359/820 |
| 6,202,961 B1 * | 3/2001 | Wilke et al. | 244/173.2 |
| 6,229,657 B1 | 5/2001 | Holderer et al. | |
| 6,381,081 B1 * | 4/2002 | Ford | 359/819 |
| 6,388,823 B1 * | 5/2002 | Gaber et al. | 359/819 |
| 6,392,825 B1 * | 5/2002 | Trunz et al. | 359/819 |
| 6,922,293 B2 * | 7/2005 | Watson et al. | 359/819 |
| 6,930,842 B2 * | 8/2005 | Shibazaki | 359/822 |
| 7,239,462 B2 * | 7/2007 | Rau et al. | 359/819 |
| 7,929,227 B2 * | 4/2011 | Bieg et al. | 359/819 |
| 2003/0197914 A1 | 10/2003 | Cox et al. | |
| 2003/0202260 A1 * | 10/2003 | Meehan et al. | 359/822 |
| 2004/0212794 A1 | 10/2004 | Mizuno | |
| 2005/0035684 A1 | 2/2005 | Fuse et al. | |
| 2005/0241899 A1 | 11/2005 | Rutz et al. | |
| 2006/0098210 A1 * | 5/2006 | Freimann et al. | 356/521 |
| 2007/0153348 A1 * | 7/2007 | Roux et al. | 359/196 |
| 2007/0183064 A1 * | 8/2007 | Shibazaki | 359/819 |
| 2007/0188731 A1 * | 8/2007 | Bezama et al. | 355/72 |
| 2007/0279768 A1 * | 12/2007 | Shibazaki | 359/811 |
| 2008/0218721 A1 * | 9/2008 | Schoeppach et al. | 355/67 |
| 2008/0278828 A1 | 11/2008 | Rau et al. | |
| 2008/0285161 A1 | 11/2008 | Geuppert et al. | |
| 2009/0180091 A1 * | 7/2009 | Farnsworth et al. | 355/67 |
| 2009/0207393 A1 | 8/2009 | Butler et al. | |

FOREIGN PATENT DOCUMENTS

| | | |
|---|---|---|
| JP | 2000-28886 | 1/2000 |
| JP | 2003-203860 | 7/2003 |
| JP | 2004-340372 | 12/2004 |
| JP | 2005-064474 | 3/2005 |
| JP | 2009-501350 | 1/2009 |
| JP | 2009-127861 | 6/2009 |
| WO | WO 2006/084657 | 8/2006 |
| WO | WO 2007/006577 | 1/2007 |

OTHER PUBLICATIONS

The International Preliminary Report on Patentability for the corresponding PCT Application No. PCT/EP2010/000200, dated Jul. 26, 2011.
The International Search Report and Written Opinion for the corresponding PCT Application No. PCT/EP2010/000200, dated Apr. 6, 2010.
The German Office Action, with English translation, for corresponding DE Appl No. 10 2009 004 954.7, dated Oct. 9, 2009.
Chinese Office Action, with translation thereof, for corresponding CN Appl No. 201080004937.6, dated Apr. 19, 2013.

* cited by examiner

DAMPING DEVICE

CROSS-REFERENCE TO RELATED APPLICATIONS

This application is a continuation of, and claims benefit under 35 USC 120 to, international application PCT/EP2010/000200, filed Jan. 15, 2010, which claims benefit under 35 USC 119 of German Application No. 10 2009 005 954.7, filed Jan. 20, 2009. International application PCT/EP2010/000200 is hereby incorporated by reference in its entirety.

FIELD OF THE DISCLOSURE

The disclosure relates to a damping device of an optical element of a projection exposure machine. The disclosure further relates to an optical element for illuminating systems and projection systems of a projection exposure machine or for systems in which an optical element is exactly positioned with a damping device.

BACKGROUND

Projection exposure machines for semiconductor lithography are used for the photolithographic production of semiconductor components and other finely structured devices. In this case, the pattern of a mask (reticle) is projected onto a substrate (wafer) usually coated with a photosensitive layer. To this end, a projection exposure machine includes a projection objective with a plurality of optical elements such as lenses, mirrors, gratings or plane parallel plates, which are supported via mounts in an objective housing of the projection objective. The optical elements refract and/or reflect electromagnetic radiation emitted by an illuminating device.

Mounting technology for optical elements of a projection objective is disclosed, for example, in U.S. Pat. No. 6,229,657 B1. U.S. Pat. No. 6,229,657 B1 discloses a mount including an inner ring permanently connected to the optical element, and an outer ring, the inner ring and the outer ring being interconnected via joints, in particular via solid joints, distributed on the periphery.

So-called manipulators can be used to compensate for aberrations. Such manipulators include an optical element and adjusting elements which are distributed on the circumference of the optical element. The adjusting elements can be used to position and/or deform the optical element. These manipulations of the optical element cause a change in the imaging which compensates an aberration of the entire system. In some embodiments, mounts for such manipulators include an inner ring or holder with which the optical element is accommodated, and an outer ring or a support device, it being possible to move the inner ring relative to the outer ring using the adjusting elements.

The joints and/or the adjusting elements decouple the optical elements, preferably from external structures, in terms of deformation. The connections between the optical element and the external structures preferably have a low stiffness.

In addition, imaging of ever smaller structures is desired in microtechnology. Larger and therefore heavier optical elements can be used for this. Both the low stiffness and the greater mass of the optical elements respectively lower the natural vibration frequencies of the system. This increases the risk of exciting the optical elements to vibrations from outside.

It is therefore disclosed, for example, in WO 2006/084657 A1, to provide a damper element between the outer ring and the inner ring.

Furthermore, it is disclosed in WO 2007/006577 A1 to provide a mass damper with an additional mass or a plurality of additional masses on the optical element, vibrational energy of the optical element being dissipated by friction using the additional mass(es). Such an additional mass is denoted below as damper mass. WO 2007/006577 A1 discloses fitting an annular damper mass on an optical element or an inner ring using a damper element. The damper element is arranged between the annular damper mass and the optical element or the inner ring and is, for example, a fibrous material such as paper, felt or an elastomer. Such mass dampers are also denoted as annular absorbers. A good vibration damping can be attained by means of annular absorbers for systems with one degree of freedom.

SUMMARY

Damping devices for absorbing or dissipating the vibration energy of an optical element of a projection exposure machine which is excited to vibrations with a number of degrees of freedom are disclosed.

In general, in one aspect, the invention features, a damping device of an optical element of a projection exposure machine, is provided which includes at least two mass dampers arranged spaced apart from one another, the mass dampers each having at least one damper mass and at least one damping element, and the damper masses of the mass dampers being interconnected by means of at least one connecting element.

The element to be damped can have an arbitrary three dimensional restricted geometric form. For example, the element is fashioned in the shape of a lens or disc.

As used herein, a "damping element" is designated as an element which has spring and/or damping properties. A spring element can be provided in a simple embodiment. The damping element may include a material which dissipates vibrational energy, for example, paper, felt and/or an elastomer. A fluoroelastomer, in particular a fluororubber, for example Viton®, can have good properties for dissipating vibrational energy. At the same time, a fluororubber may be suitable for application in a projection objective because of the vacuum resistance and the good thermal and UV resistance. Other elastomers are also advantageous depending on application.

The natural frequencies of the mass dampers can be designed for a frequency to be eliminated. Given this frequency, the mass dampers draw vibrational energy from the structure, i.e., the optical element excited to vibration. The mass dampers act in each case as segmented absorbers, and so it is possible to damp a plurality of degrees of freedom. The damper masses of the mass dampers are interconnected such that the damper masses provide mutual support. In each case, mutually adjacent damper masses are preferably interconnected via a connecting element or a plurality of connecting elements. The support of the damper masses eliminates parasitic solid-state modes such as can occur with conventional segmented absorbers. In some embodiments, the individual mass dampers are operationally connected to the element at attachment points distributed discretely over the periphery of the element to be damped. This renders it possible to target the placement of the mass dampers at vibration excitation points and/or points of maximum vibration amplitudes. In some embodiments, a plurality of discrete, i.e., spatially distributed, attachment points are provided for a damper mass.

In certain embodiments, a mass of a connecting element is less than the mass of a damper mass. As a result of this, the connecting elements have a high natural frequency and are not excited to flexural vibrations or are excited at least only in a high frequency range which is of little relevance to the associated system, for example, in a range of greater than 1,000 Hz. In addition, or as an alternative, the natural frequency of the connecting element can be influenced by its stiffness. For example, the connecting element stiffness can be selected so that the connecting element displacesparasitic vibrational modes into an uncritical range, for example, a range of greater than 1,000 Hz.

In some embodiments, at least two damper masses and a connecting element are designed as a conjoint component, in particular as a unipartite or integral component. The component can be fashioned as an annular element, e.g., as a closed annular element. Such an annular element can be arranged in a simple way on the rotationally symmetrical element. Other configurations of the component can be provided which are matched to the shape of the element to be damped. For example, a closed annular element can be provided which has three damper masses and three connecting elements arranged in an alternating fashion. It is usual for three translational and three rotational vibrational modes to occur. These can be effectively absorbed by three damper masses in conjunction with a simple design of the system.

In general, the component preferably has at least one joint. The joint decouples a damper mass and an adjacent connecting element for a vibration transmission. Joints may be solid joints. A spot on a unipartite component which has reduced flexural stiffness at least as compared with the damper mass is denoted as "solid joint". A solid joint can be implemented in a simple manner in a unipartite component. For example, the solid joint may be provided as a reduction in the cross section of the component, e.g., a discontinuous or sudden reduction in the cross section. The reduction in the cross section can be provided in such a way that the connecting element and the solid joint are fashioned as segments of the component with the same cross section. In some embodiments, the solid joint has a smaller cross section than the damper mass and than the connecting element. A reduction in the cross section can be implemented by a variation in the height of the annular element. Alternatively, or in addition, a variation in the radius of the annulus is provided. In some embodiments, the component includes a plurality of discrete damper masses which are interconnected by means of spring elements. The spring elements function in this case, for example, as connecting masses and as joints. Alternatively, or in addition, a hinge is provided.

The component can be coupled directly or indirectly to the element to be damped at at least one bearing point. A further stabilization in the x- and y-directions is attained owing to the bearing point. The bearing point can be fashioned and/or arranged so as not to impair a vibrational response in the z-direction of the damping device. In some embodiments, the bearing point is arranged in a vibration node. The bearing can be movable in the z-direction. In the case of an optical element, the bearing point can be provided on an inner ring accommodating the optical element such that an indirect attachment results.

In some embodiments, at least one of the vibration absorbers has at least two or more damping elements. The damper mass can be coupled to the element to be damped with the damping elements. The damper mass and the damping elements may be tuned to one another so that the damper mass constitutes a vibration form whose maximum vibration amplitude lies in the region of the damping elements.

In some embodiments, an optical element for a projection objective of a projection exposure machine is provided with the damping device. The mass dampers, in particular the damper masses, the damping elements and/or the attachment points can be optimally adapted in terms of their arrangement, size and/or number to vibration forms of the element to be damped. In other words, the vibration form of the damping device matches in an adaptive fashion to the optical element, for example a manipulator.

The damping device can be fastened on the periphery of the optical element. In some embodiments, the damping device is fastened on the periphery of a holder accommodating the optical element. The holder is, for example, the inner ring of a mount. In this case, the arrangement can be suitably selected depending on the application.

In certain embodiments, a projection exposure machine with an optical element is provided. It is possible in this case to provide an optimum damping of vibration to avoid and/or reduce aberrations. Vibrations can be eliminated by the damping device, and parasitic natural frequencies of the mass damper can be shifted into ranges which are considered harmless for the projection exposure machine. Such harmless frequency ranges can lie, for example, above approximately 1,000 Hz for known projection exposure machines.

The above and other features will be apparent from the description, the drawings and the claims. In general, features can be implemented individually or in combination. Uniform reference symbols are used in the drawings for identical or similar components.

DETAILED DESCRIPTION

Figure 1:
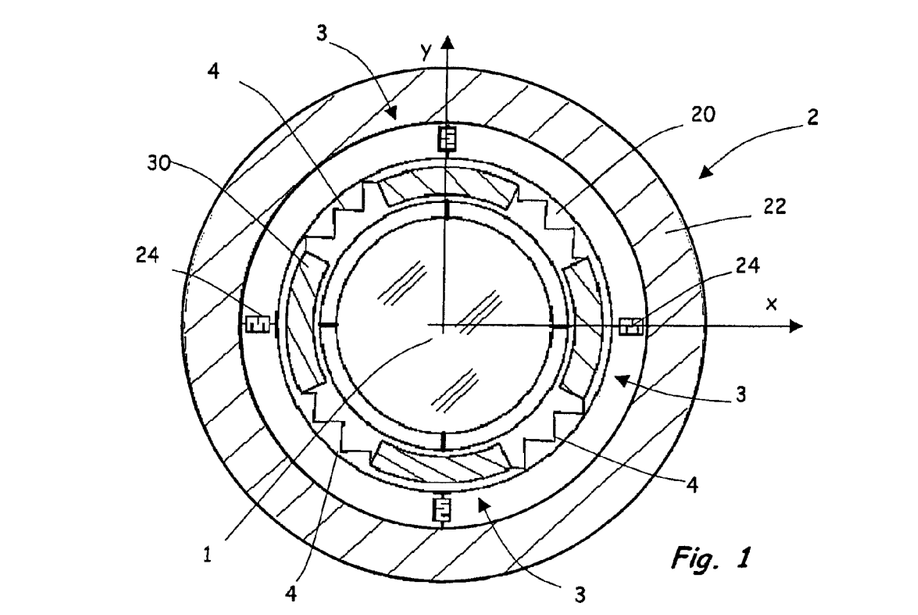
FIG. 1: shows a top view of an optical element with a damping device.
Figure 2:
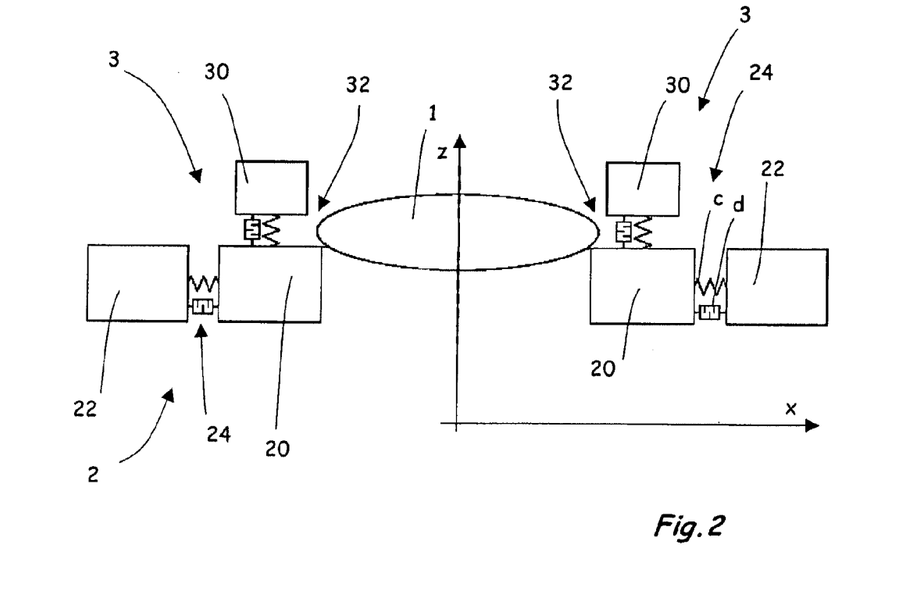
FIG. 2: shows a side view of the device in accordance with FIG. 1.

FIGS. 1 and 2 show diagrammatically an optical element 1 with a mount 2 and a damping device. Here, FIG. 1 shows a top view, and FIG. 2 a side view of the system. The optical element 1 is, for example, a lens that is supported in a conventional way in a mount 2 comprising an inner ring 20 and an outer ring 22. Various mounting technologies are disclosed, for example, in U.S. Pat. No. 6,229,657 B1, the entire contents of which is incorporated hereby by reference.

The inner ring 20 is rigidly connected to the optical element 1. The inner ring 20 is mounted in the outer ring 22 via bearings 24. The bearings 24 illustrated diagrammatically in FIGS. 1 and 2 are, for example, fashioned as solid joints with a stiffness c and a damping d. It is possible to provide between the outer ring 22 and the inner ring 20 further adjusting elements with a sensor system and/or actuator system (not illustrated) which can be used to displace and/or deform the optical element 1 actively by comparison with the outer ring 22.

Provided on the optical element 1 is a damping device with a plurality of mass dampers 3 for the purpose of dissipating vibrational energy. The damping device comprises at least two mass dampers 3 distributed over the periphery of the optical element 1. In the exemplary embodiment illustrated in FIGS. 1 and 2, four mass dampers 3 are provided which are distributed uniformly over the periphery of the optical element 1. In other refinements, more or less than four mass dampers 3 are provided, it being possible for the mass dampers 3 to be distributed uniformly or non-uniformly over the periphery of the optical element 1.

Figure 6:
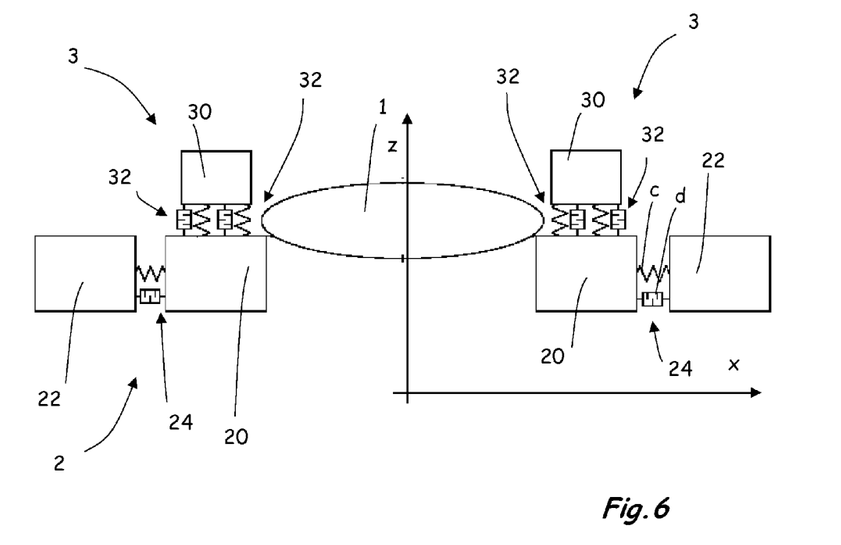
FIG. 6: shows a side view of the device in accordance with FIG. 1.

The mass dampers 3 comprise a damper mass 30 each. The damper masses 30 are connected to the inner ring 20 and/or the optical element 1 via at least one damping element 32 or a plurality of damping elements 32, each (FIG. 6). The mass dampers 3 are arranged on the inner ring 20 in the exemplary embodiment illustrated diagrammatically in FIGS. 1 and 2. In some embodiments, the mass dampers 3 are fitted directly on the optical element 1, for example, being bonded thereto. As may be seen from FIG. 2, the damping elements 32 are designed as spring damper elements in the embodiment illustrated. The damping elements 32 of different damper masses 30 are spatially separated from one another such that the damper masses 30 are connected to the structure to be damped, for example the optical element, at spatially separated attachment points.

As may be seen from FIG. 1, the individual damper masses 30 are connected via connecting elements 4 whose mass is less than the mass of the damper masses 30. The connecting elements 4 are illustrated diagrammatically as stiff spring elements in FIG. 1. The stiffness of the connecting elements 4 depends on a material used for this purpose, and on the geometry, especially the cross-sectional area, of the connecting elements 4. Because of the low mass of the connecting elements 4, the connecting elements 4 are not excited to flexural vibrations or are excited to flexural vibrations only in a very high frequency range. The damper masses 30 are supported against one another in x- and y-directions by the connecting elements 4. As a result, parasitic solid-state modes such as can occur, for example, in the case of a damping device with segmented absorbers known from the prior art generally do not arise.

The damper masses 30 can be optimally adapted to vibration forms of the optical element in terms of their arrangement, size and/or number. Alternatively or in addition, it is possible to influence the damping behaviour by optimizing the number and/or arrangement of the damping elements 32 and/or a variable of the damping elements 32.

Figure 3:
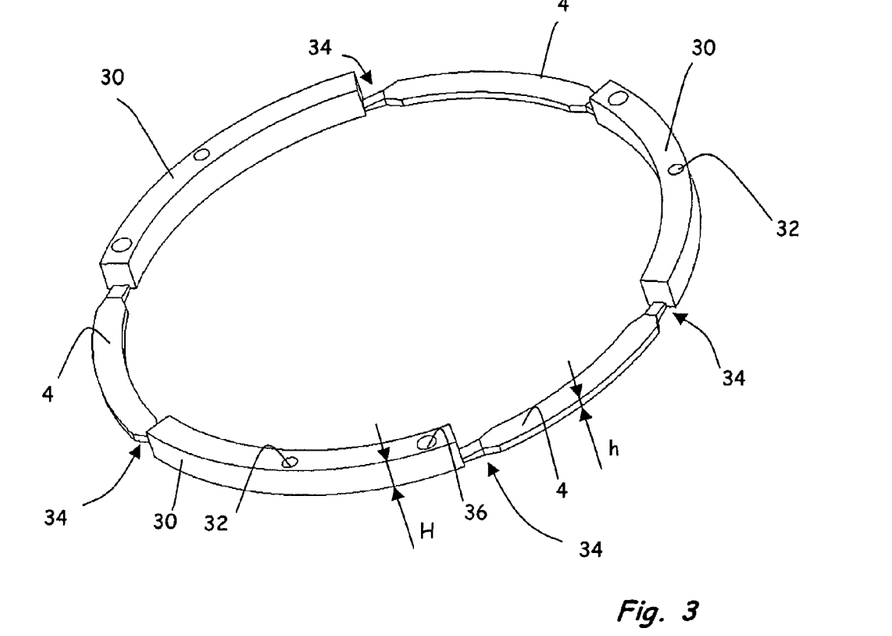
FIG. 3: shows a damping mass for a damping device in accordance with FIG. 1.

FIG. 3 is a diagram of a component for an optimized damping device, the damping masses 30 and the connecting elements 4 being designed as integral parts of the component. The component is designed as a closed circular ring, three damper masses 30 and three connecting elements 4 being arranged alternating with one another. The connecting elements 4 have a lesser height h by comparison with the height H of the damper masses 30, and therefore a smaller cross section. The height H of the damper masses 30 is, for example, approximately twice to eight times the height h of the connecting elements 4. Because of the reduced cross section, there is a reduction in stiffness in the transition between the damper masses 30 and the connecting elements 4 such that a solid joint 34 results. Furthermore, constrictions are provided in the region of the solid joints 34 in the embodiment illustrated. Because of the different cross section, the mass of the damper masses 30 is higher than the mass of the connecting elements 4. In some embodiments, a material with an E-modulus of at least approximately $70 \times 10^9$ N/m², in particular of approximately $190 \times 10^9$ N/m² can be used. It is thereby possible to provide connecting elements 4 of adequate stiffness using a comparatively small cross-sectional area and thus low mass, such that the natural frequency of the connecting elements 4 is very high and lies in a range causing no damage to the optical element. The entire damper mass is preferably approximately 7% to approximately 12% of the mass of the optical element.

Furthermore, bearing points 36 are provided in the embodiment illustrated for the purpose of supporting the damper masses 30. The bearing points 30 are preferably situated in the region of vibration nodes. In some embodiments, the bearing points 36 are provided in the region of the connecting elements 4. In the embodiment illustrated in FIG. 3, the damper masses 30 are attached to the inner ring 20 in accordance with FIG. 1 using cylindrical damping elements 32, which are also denoted as braids, and are illustrated schematically in FIG. 4. In the embodiment illustrated, one damping element 32 is provided per damper mass 30. In general, more than one damping elements per damper mass can be provided. For example, two or more damping elements are provided per damper mass 30.

Figure 4:
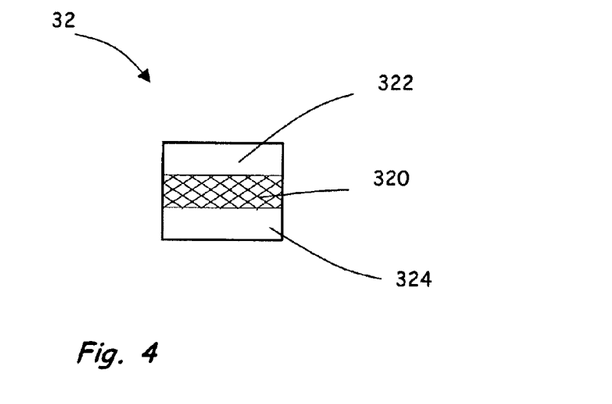
FIG. 4: shows a damping element for a damping device.

FIG. 4 is a diagram of a damping element 32. The damping element 32 includes a layer 320 made from a material which dissipates vibrational energy, being able to do so by friction. Paper, felt or the like are examples in this case. In some embodiments, the material is an elastomer, in particular a fluoroelastomer or fluororubber. Such an elastomer has good characteristics which dissipate vibrational energy. At the same time, a fluoroelastomer is suitable for application in a projection objective. A disc, in particular a metal disc 322, 324, is respectively provided on each side of the layer 320. The metal discs 322, 324 are permanently connected to the elastomer 320, for example, by vulcanization.

The following parameters, for example, are thus available for setting the damping characteristics of the passive damping device: a number and distribution of the mass dampers 3, a number of the damping elements 32, a distribution of the damping elements 32 for each damping mass 30, a thickness of the layer 320 of the damping elements 32, a distribution of the damping masses 30 on the optical element 1, a mass of the damping masses 30, a stiffness of the connecting elements 4 and/or a mass of the connecting elements 4. It is thereby possible to match the damping device 3 well to the optical element 1 and/or to an associated manipulator. Consequently, a damping action can be greatly increased and adapted to different vibrational modes.

Figure 5:
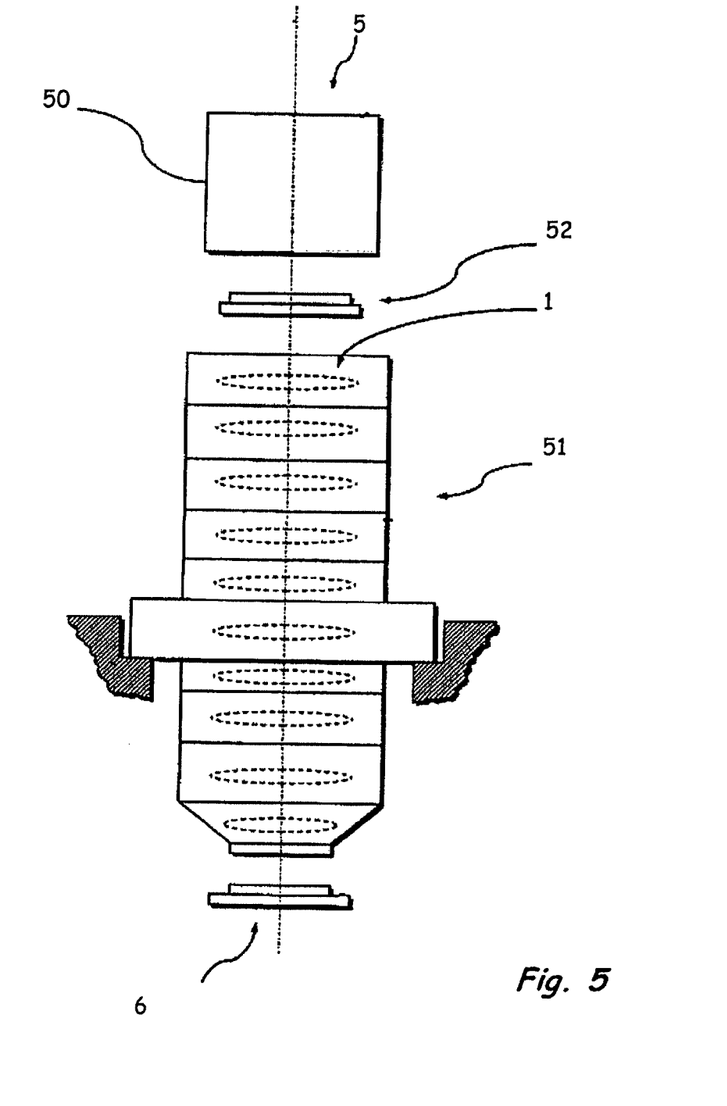
FIG. 5: shows a projection exposure machine.

FIG. 5 is a diagram of a projection exposure machine 5. The projection exposure machine includes an illuminating device 50 with which an illuminating radiation is produced, and a projection objective 51. Arranged between the projection objective 51 and the illuminating device 50 is a mask 52 with a pattern, the pattern of the mask 52 being projected onto a substrate 6 arranged beneath the projection objective 51. The projection objective 51 includes various optical elements 1 such as lenses, mirrors, gratings or the like. In some embodiments, a manipulator or a plurality of manipulators are provided to compensate aberrations based on heating or the like. The manipulators respectively include an optical element 1 in accordance with FIG. 1, and a sensor system and/or actuator for positioning and/or deforming the optical element 1.

The optical elements 1 can be supported in accordance with FIG. 1 using a mount comprising an inner ring 20 and an outer ring 22. The outer rings 22 are accommodated in this case in a housing of the projection objective 51. A damping device illustrated diagrammatically in FIGS. 1 to 4 may be provided on at least one of the optical elements 1 for the purpose of absorbing vibrational energy.

Other embodiments are in the following claims.

The invention claimed is:

1. A system, comprising:
   an optical element selected from the group consisting of a lens, a mirror and a grating;
   a housing;
   a mount supporting the optical element in the housing; and
   a damping device, comprising:
      at least two mass dampers connected to the mount, each of the at least two mass dampers comprising an additional damper mass and a damping element; and
      a connecting element which interconnects the additional damper masses of the at least two mass dampers,
   wherein:
      for each of the at least two mass dampers, additional damper mass is connected to the mount via the damping element; and
      the system is a lithographic system.

2. The system of claim 1, wherein a mass of the connecting element is less than the mass of an additional damper mass.

3. The system of claim 1, wherein the connecting element has a stiffness sufficient to displace parasitic vibrational modes of the mass dampers into a range of greater than 1,000 Hz.

4. The system of claim 1, wherein the connecting element and the additional damper masses are a conjoint component.

5. The system of claim 4, wherein the conjoint component is an annular element.

6. The system of claim 4, wherein the conjoint component comprises a joint that decouples an additional damper mass and an adjacent connecting element for a vibration transmission.

7. The system of claim 6, wherein the joint is a solid joint that corresponds to a reduction in a cross section of the component.

8. The system of claim 4, wherein the conjoint component is coupled to the optical element at at least one bearing point.

9. The system of claim 1, wherein at least one of the mass dampers has at least two damping elements which couple the additional damper mass to the element to be damped.

10. The system of claim 1, wherein the damping element comprises a material selected from the group consisting of paper, felt and an elastomer.

11. The system of claim 1, wherein the damping element comprises a fluoroelastomer.

12. The system of claim 1, wherein the damping element comprises a fluororubber.

13. The system of claim 1, wherein the mount comprises an outer ring and an inner ring mounted in the outer ring, and the inner ring is rigidly connected to the optical element.

14. The system of claim 13, wherein the at least two mass dampers are connected to the inner ring.

15. The system of claim 1, wherein the mount comprises an outer ring and an inner ring mounted to the outer ring.

16. The system of claim 15, wherein, for each of the at least two mass dampers, the additional damper mass is connected to the inner ring.

17. The system of claim 1, wherein the at least two mass dampers are configured to dissipate vibrational energy of the optical element.

18. A machine, comprising:
   a system comprising:
      an optical element selected from the group consisting of a lens, a mirror and a grating;
      a housing;
      a mount supporting the optical element in the housing; and
      a damping device, comprising:
         at least two mass dampers connected to the optical element, each of the at least two mass dampers comprising an additional damper mass and a damping element; and
         a connecting element which interconnects the additional damper masses of the at least two mass dampers,
   wherein:
      for each of the at least two mass dampers, the additional damper mass is connected to the mount via the damping element; and
      the machine is a lithography projection exposure machine.

19. The projection exposure machine of claim 18, wherein the damping element comprises a material selected from the group consisting of paper, felt and an elastomer.

20. The projection exposure machine of claim 18, wherein the damping element comprises a fluoroelastomer.

21. The projection exposure machine of claim 18, wherein the damping element comprises a fluororubber.

22. The machine of claim 18, wherein the mount comprises an outer ring and an inner ring mounted in the outer ring, and the inner ring is rigidly connected to the optical element.

23. The system of claim 22, wherein the at least two mass dampers are connected to the inner ring.

24. The machine of claim 18, wherein the mount comprises an outer ring and an inner ring, and the inner ring is mounted to the outer ring.

25. The system of claim 24, wherein, for each of the at least two mass dampers, the additional damper mass is connected to the inner ring.

26. The machine of claim 18, wherein the at least two mass dampers are configured to dissipate vibrational energy of the optical element.

27. A system, comprising:
   an optical element selected from the group consisting of a lens, a mirror and a grating;
   a housing;
   a mount supporting the optical element in the housing; and
   a damping device, comprising:
      a first mass damper connected to the mount, the first mass damper comprising a first additional damper mass and a first damping element;
      a second mass damper connected to the mount, the second mass damper comprising a second additional damper mass and a second damping element; and
      a connecting element which interconnects the first and second additional damper masses,
   wherein:
      the first damper mass is connected to the mount via the first damping element;
      the second damper mass is connected to the mount via the second damping element; and
      the system is a lithographic system.

28. The system of claim 27, wherein the mount comprises an outer ring and an inner ring mounted in the outer ring, the inner ring is rigidly connected to the optical element, the first mass damper is connected to the inner ring, and the second mass damper is connected to the inner ring.

29. The system of claim 27, wherein the mount comprises an outer ring and an inner ring mounted to the outer ring, the first mass damper is connected to the inner ring, and the second mass damper is connected to the inner ring.

30. The system of claim 27, wherein the at least two mass dampers are configured to dissipate vibrational energy of the optical element.

31. A machine, comprising:
a system comprising:
an optical element selected from the group consisting of a lens, a mirror and a grating;
a housing;
a mount supporting the optical element in the housing; and
a damping device, comprising:
a first mass damper connected to the mount, the first mass damper comprising a first additional damper mass and a first damping element;
a second mass damper connected to the mount, the second mass damper comprising a second additional damper mass and a second damping element; and
a connecting element which interconnects the first and second additional damper masses,
wherein:
the first damper mass is connected to the mount via the first damping element;
the second damper mass is connected to the mount via the second damping element; and
the machine is a lithography projection exposure machine.

32. The machine of claim 31, wherein the mount comprises an outer ring and an inner ring mounted in the outer ring, the inner ring is rigidly connected to the optical element, the first mass damper is connected to the inner ring, and the second mass damper is connected to the inner ring.

33. The machine of claim 31, wherein the mount comprises an outer ring and an inner ring mounted to the outer ring, the first mass damper is connected to the inner ring, and the second mass damper is connected to the inner ring.

34. The machine of claim 31, wherein the at least two mass dampers are configured to dissipate vibrational energy of the optical element.

* * * * *

UNITED STATES PATENT AND TRADEMARK OFFICE
CERTIFICATE OF CORRECTION

PATENT NO.       : 9,513,452 B2                                  Page 1 of 1
APPLICATION NO.  : 13/185177
DATED            : December 6, 2016
INVENTOR(S)      : Alexander Vogler et al.

It is certified that error appears in the above-identified patent and that said Letters Patent is hereby corrected as shown below:

In the Claims

Column 7, Line 24, Claim 1, before "additional", insert -- the --.

Signed and Sealed this
Ninth Day of May, 2017

Michelle K. Lee
*Director of the United States Patent and Trademark Office*